(12) United States Patent
Sarashina et al.

(10) Patent No.: US 6,217,669 B1
(45) Date of Patent: Apr. 17, 2001

(54) CLEANING APPARATUS AND CLEANING METHOD

(75) Inventors: Eigo Sarashina, Kofu; Ken Takahashi, Yamanashi; Masuo Masui, Yamanashi; Takao Naito, Yamanashi, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/155,795
(22) PCT Filed: May 26, 1997
(86) PCT No.: PCT/JP97/01784
  § 371 Date: Oct. 6, 1998
  § 102(e) Date: Oct. 6, 1998
(87) PCT Pub. No.: WO97/45268
  PCT Pub. Date: Dec. 4, 1997

(30) Foreign Application Priority Data

May 28, 1996 (JP) .................................... 8-132913

(51) Int. Cl.[7] ................................. B08B 5/04; B08B 7/04
(52) U.S. Cl. ................................. 134/18; 134/21; 15/308; 15/309.2; 15/312.1
(58) Field of Search .................... 134/21, 18; 15/308, 15/309.2, 312.1

(56) References Cited

U.S. PATENT DOCUMENTS 5,491,871  2/1996  Reber et al. ........................ 15/308

FOREIGN PATENT DOCUMENTS

| 0 341 212 A1 | 11/1989 | (EP) . |
| 0 680 247 A1 | 11/1995 | (EP) . |
| 5-229109 | * 9/1993 | (JP) . |
| 6-071868 | * 3/1994 | (JP) . |
| 6-238866 | * 8/1994 | (JP) . |

OTHER PUBLICATIONS

Patent abstracts of Japan; vol. 17, No. 679 (M–1527); Dec. 14, 1993 & JP 05 229108 a (Hitachi Techno Eng Co Ltd); Sep. 7, 1993 *abstract*.

* cited by examiner

*Primary Examiner*—Zeinab El-Arini
(74) *Attorney, Agent, or Firm*—Parkhurst & Wendel, LLP

(57) ABSTRACT

In a printing device in which a printing material is printed on or applied to a to-be-printed surface of a circuit board through a screen mask for printing having openings formed therein in a predetermined pattern, it is intended to reliably remove cream solder remaining in the openings in the screen mask. After an air suction mechanism (19) has its flow rate controlled by a flow rate controller (20). An air suction section (15) is lifted until its front end contacts with the screen mask (5), the air suction mechanism (19) starts cleaning by sucking air from the openings (6) in the screen mask (5). An inspecting camera (2) is used to observe the cream solder (4) remaining in the openings (6) after cleaning, and the air suction flow rate is controlled according to the results thereof to effect cleaning again.

4 Claims, 4 Drawing Sheets

PRIOR ART

CLEANING APPARATUS AND CLEANING METHOD

This is a national stage application of PCT/JP97/01784 filed May 26, 1997.

TECHNICAL FIELD

The present invention relates in general to a cleaning device for screen masks used in a screen printing device and specifically to a device and a method for cleaning the edges of pattern holes in a screen mask to remove a printing material adhering to said edges.

BACKGROUND ART

Heretofore, for example, in the production of electronic circuit boards, a printing material, such as cream solder, has been used to solder electronic parts, such as chip parts, on a circuit board, and a cream solder printing device has been used to print or apply said cream solder in a desired pattern. Conventional printing of cream solder has been effected by using the following method and device. Referring to FIG. 4, the numeral 1 denotes a circuit board; 2 denotes a land to have cream solder 4 printed thereon; 3 denotes a solder resist; 5 denotes a screen mask of metal formed with openings 6 in a desired pattern; and 7 denotes a printing squeegee adapted to make a linear movement on the screen mask 5.

Cream solder printing comprises the steps of placing a screen mask 5 in position on a circuit board 1, feeding cream solder 4 onto the screen mask 5, linearly moving said squeegee 7 in contact with the screen mask 5 under a suitable printing pressure to fill the cream solder 4 into openings 6 in the screen mask 5, and separating the screen mask 5 from the circuit board 1, whereby the cream solder 4 is printed or applied on the circuit board 1 in a desired pattern through the screen mask 5.

In this connection, if the cream solder printing is continuously performed, the cream solder 4 moves around to the back of the screen mask 5 to adhere thereto as shown in FIG. 4 (b).

When such adhering cream solder 4 is transferred to the circuit board 1, it forms a cause of short circuit or the like. Therefore, usually the printing device is provided with a cleaning device 9 as shown in FIG. 5 so as to make it possible to remove the adhering cream solder 4. In this figure, the numeral 10 denotes a cleaning squeegee; 11 denotes a cleaning paper; 12 denotes a cleaning paper supply source; and 13 denotes a cleaning paper winding section. In addition, 8 denotes a frame.

The cleaning operation is performed as follows. First, the cleaning device 9 is moved in its entirety to the position A, where the cleaning squeegee 10 is then lifted until it comes in contact with the screen mask 5 through the cleaning paper 11. And with this state maintained, the cleaning device 9 is moved toward the position B. When the cleaning device 9 reaches the position B, the cleaning squeegee 10 is lowered, and the portion of the cleaning paper 11 which has been used for cleaning is wound by the cleaning paper winding section 13 while the cleaning paper 11 is fed from the cleaning paper supply source 12. Thereafter, the cleaning squeegee 10 is lifted again and moved toward the position A in the same manner as described above. When it reaches the position A, the cleaning squeegee 10 is lowered and the cleaning device 9 is returned to its original position to complete the cleaning.

Further, in recent years, in addition to the above arrangement, as shown in FIG. 6, there has been proposed an arrangement comprising a cleaning device 14 provided with an air sucking section 15 connected to an air suction mechanism 19. The numeral 17 denotes a supply source which supplies a cleaning paper 16 and 18 denotes a winding section therefor. In cleaning operation, the air sucking section 15 is moved to the position A and lifted until its front end contacts with the screen mask 5. With this state maintained, the air sucking section 15 is moved toward the position B along the screen mask 5 to remove the cream solder 4 adhering to the openings and the back of the screen mask 5. That is, the air sucking section 15 connected to the air suction mechanism 19 is held in contact with the screen mask 5 through the cleaning paper 16 which is air-permeable to the extent that air easily passes therethrough, while the cream solder 4 adhering to the openings 6 is recovered by the cleaning paper 16 through the suction of air. After the cream solder 4 adhering to the openings 6 has been removed in this manner, the suction of air by means of the air suction mechanism is brought to an end and the air sucking section 15 is lowered, whereupon the initial state is restored to complete the cleaning operation.

According to this printing device using air suction, the rate of removal of cream solder 4 can be increased as compared with the cleaning using the cleaning paper 11 alone.

However, even with said conventional printing device used, some amount of cream solder 4 remains on the screen mask 5, presenting a problem that such remnant results in disfigurement or blur on the print surface. Particularly, the physical properties of the cream solder 4 influence this problem such that if the cream solder 4 has high viscosity, it tends to remain.

The present invention solves the foregoing problem and has an object to provide a cleaning device and a cleaning method that eliminate the possibility of allowing a printing material such as cream solder to be left over on the screen mask.

DISCLOSURE OF THE INVENTION

A cleaning device according to the present invention is used for removing a remnant printing material from a screen mask used in a screen printing process in which a printing material is printed on or applied to the surface of a to-be-printed object through the screen mask having openings formed therein in a predetermined pattern, and comprises suction means for sucking said remnant printing material from the screen mask, reciprocating means for reciprocating said suction means along the screen mask, flow rate selecting means for registering in advance a plurality of values as registered set values for the suction flow rate in said suction means and selecting a suitable suction flow rate from said registered set values according to said object or said printing material, and flow rate variable control means for controlling the suction flow rate in said suction means to make it equal to the suction flow rate selected by said flow rate selecting means, wherein flow control is effected such that a suction flow rate suitable for the type of cream solder to be used and the shape of the openings in the screen mask is properly selected by said flow rate selecting means.

Another cleaning device according to the present invention is used for removing a remnant printing material from a screen mask used in a screen printing process in which a printing material is printed on or applied to the surface of a to-be-printed object through the screen mask having openings formed therein in a predetermined pattern, and comprises suction means for sucking a remnant printing material from the screen mask, reciprocating means for reciprocating said suction means along the screen mask, flow rate selecting means for registering in advance a plurality of values as registered set values for the suction flow rate in said suction means and selecting a suitable flow rate from said registered set values according to said to-be-printed object or said printing material, flow rate variable control means for controlling the suction flow rate in said suction means to make it equal to the suction flow rate selected by said flow rate selecting means and inspecting means for inspecting the printing material printed on or applied to the surface of said object after printing, said flow rate variable control means being further controlled according to the results of the inspection conducted by said inspecting means, wherein the printed surface of said object is inspected after printing and if disfigurement, blur or the like is found in said object, a decision is made that the printing material such as cream solder remains on the screen mask, whereupon the flow rate in the sucking section is further controlled and cleaning is performed again. Thus, the remnant printing material on the screen mask which influences the object can be reliably removed.

A cleaning method according to the present invention is used for removing a remnant printing material from a screen mask used in a screen printing process in which a printing material is printed on or applied to the surface of a to-be-printed object through the screen mask having openings formed therein in a predetermined pattern, and comprises the steps of registering in advance a plurality of values as registered set values for the suction flow rate for sucking said remnant applied material from the screen mask, and selecting a suitable suction flow rate from said registered set values according to said object or said printing material thereby to perform a cleaning of the screen mask, wherein a flow rate which is suitable for the type of the printing material to be used and the shape of the openings in the screen mask can be easily selected, so that the method is applicable to many types of production machines.

Another cleaning method according to the present invention is used for removing a remnant printing material from a screen mask used in a screen printing process in which a printing material is printed on or applied to the surface of a to-be-printed object through the screen mask having openings formed therein in a predetermined pattern, and comprises the steps of registering in advance a plurality of values as registered set values for the suction flow rate for sucking said remnant applied material from the screen mask, selecting a suitable suction flow rate from said registered set values according to said object or said printing material inspecting the printing material printed on or applied to the surface of the object after printing, and variably controlling the suction flow rate according to the results of said inspection, thereby to perform the cleaning of the screen mask.

BEST MODE FOR EMBODYING THE INVENTION

Embodiments of the invention will now be described with reference to the drawings.

(Embodiment 1)

Figure 1:
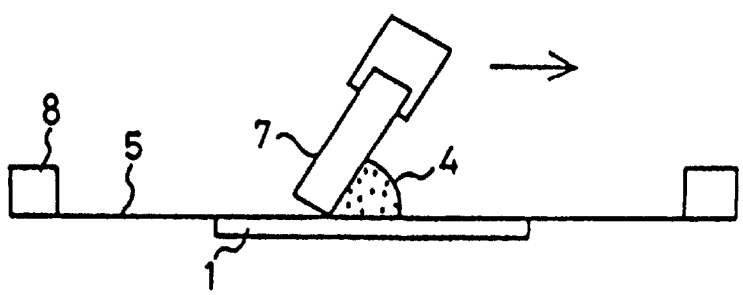
FIGS. 1(a) and (b) are a view of the principal portion of a cream solder printing machine provided with a cleaning device according to an embodiment of the invention and a schematic sectional view of the cleaning device, respectively.
Figure 2:
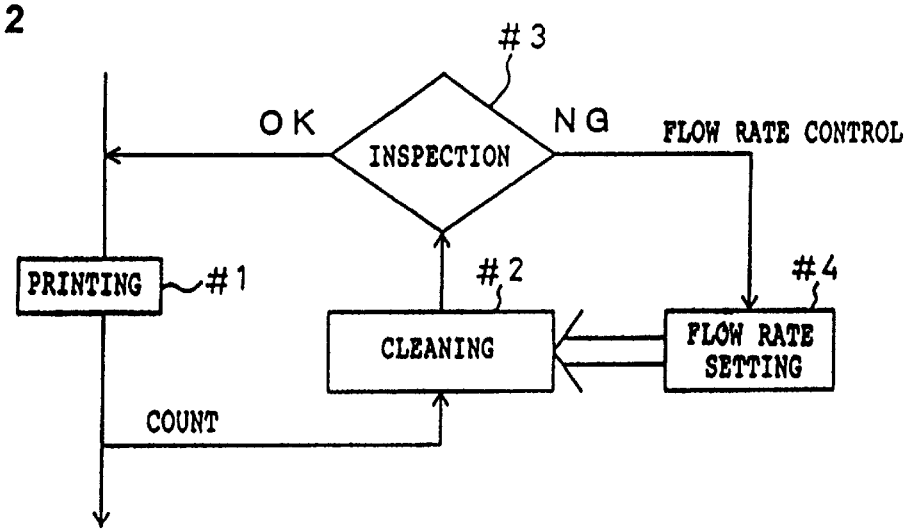
FIG. 2 is a flowchart showing a cleaning process according to the embodiment of the invention.

FIGS. 1(a) and (b) are a view of the principal portion of a cream solder printing machine provided with a cleaning device according to an embodiment of the invention and a schematic sectional view of the cleaning device, respectively, wherein the same components as those described in the conventional examples are marked with the same reference characters as those used therein and a description thereof is omitted. In this embodiment, an air suction mechanism 19 for a cleaning device 25 is provided with a flow controller 20 for controlling the flow rate of air to be sucked. Further, an inspection camera 24 is provided for observing the cream solder 4 remaining on the screen mask 5 and the cream solder 4 on the board 1. In addition, the numeral 21 denotes a driver for moving an air sucking section 15 horizontally along the screen mask 5. FIG. 2 shows the cleaning process of a cream solder printing machine in an embodiment of the invention.

In this cream solder printing machine, during printing, as shown in FIG. 1(a), the screen mask 5 is placed in position on the circuit board 1, the cream solder 4 is fed onto the screen mask 5, and then a squeegee 7 is linearly moved in contact with the screen mask 5 under a suitable printing pressure so as to fill the cream solder 4 into the openings 6 in the screen mask 5, thereby printing or applying the cream solder 4 on the circuit board 1 in a desired pattern (see step #1 in FIG. 2).

Figure 1B:
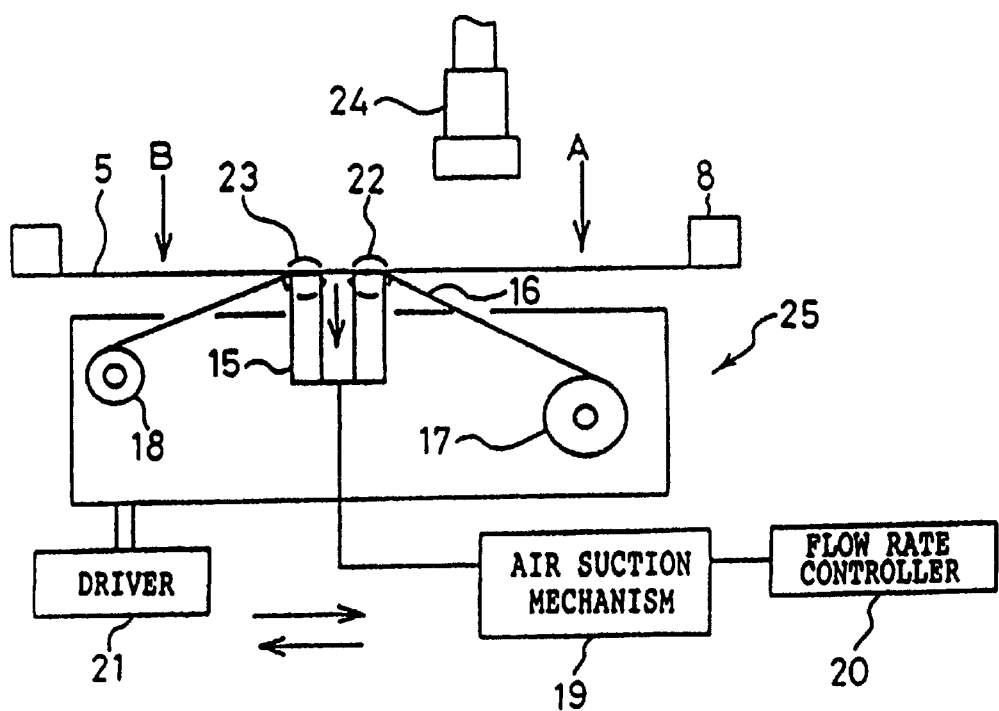

Then, as shown in FIG. 1(b), the air sucking section 15 of the cleaning device 25 is moved to the position A and then lifted until its front end contacts with the screen mask 5, whereupon the air suction mechanism 19 starts to apply air suction to the openings 6 in the screen mask 5. With this state maintained, the air sucking section 15 is synchronously moved toward the position B along the screen mask 5 to remove the cream solder 4 adhering to the openings 6 in and the back of the mask screen 5 (see step #2).

More particularly, first the air sucking section 15 connected to the air suction mechanism 19 is contacted with the screen mask 5 through a cleaning paper 16 which is air-permeable to the extent that air easily passes therethrough, and the air being sucked forces the cream solder 4 adhering to the openings 6 to flow out to the back of the screen mask 5, so that the cream solder 4 flowing out and adhering thereto is recovered at a contact area 22 by the cleaning paper 16. When the air sucking section 15 is thus moved to the point B while cleaning, the suction of air by the air suction mechanism 19 is stopped and the air sucking section 15 is lowered to the original position.

And thereafter, the cream solder 4 remaining in the openings 6 in the screen mask 5 is observed by the inspection camera 24 (step #3). In this case, the amount of the cream solder 4 remaining in the openings 6 is set in advance at an optional value, such as 20%, with respect to the area of the openings (step #4), so that if the amount of the cream solder 4 remaining in the openings 6 as found from the results of the inspection is greater than the preset amount of the remnant solder, the cleaning operation is repeated, and this cleaning operation is stopped at a point of time when the amount of the solder remaining in the openings 6 is less than the preset amount of the remnant cream solder 4. In this manner, the cleaning operation of the screen mask 5 is completed. In addition, the description has been given of a case in which the amount of the cream solder 4 remaining in the openings 6 is optionally set. However, several amounts, such as 10% and 20%, of the cream solder 4 to be set in advance may be registered so that a desired value may be selected therefrom (see step #5 in FIG. 3).

In performing this cleaning, the amount by which the suction flow rate in the air suction mechanism 19 in repeating the cleaning operation is increased in advance according to the results of the inspection is set as by increasing the frequency of the inverter control motor for driving the suction pump to increase the rpm of the motor; thus, in repeating the cleaning operation, the flow rate in the air suction mechanism 19 can be automatically increased to perform cleaning. In addition, when the next cleaning is to be performed following the printing subsequent to the cleaning performed with the flow rate increased according to the results of inspection, it may be performed using the flow rate which has been increased last time.

(Embodiment 2)

Figure 3:
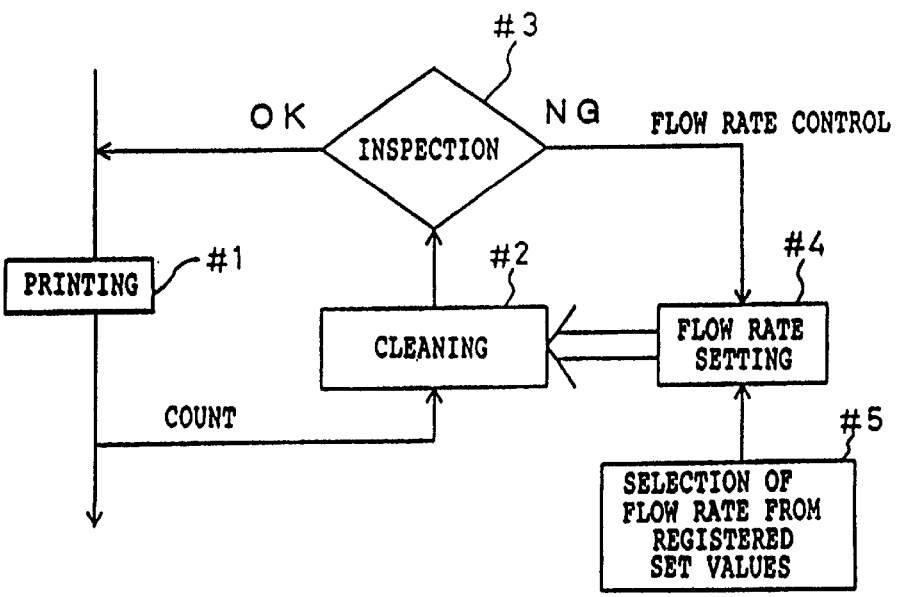
FIG. 3 is a flowchart showing a cleaning process according to another embodiment of the invention.
Figure 4A:
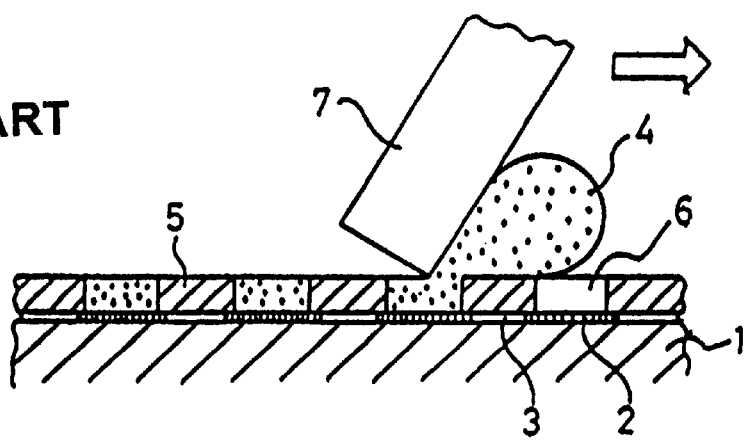
FIGS. 4(a) and (b) are schematic sectional views showing printed states of cream solder.
Figure 4B:
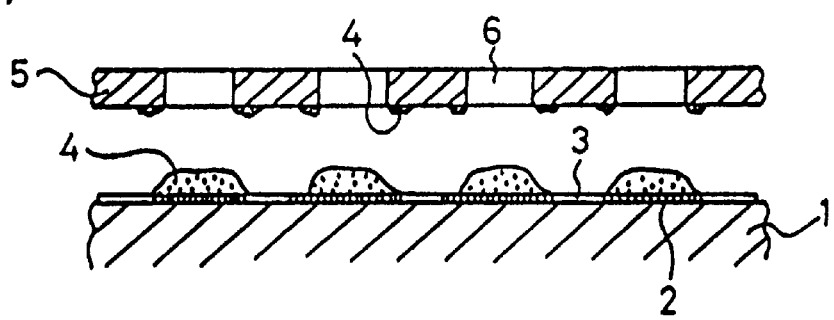
Figure 5:
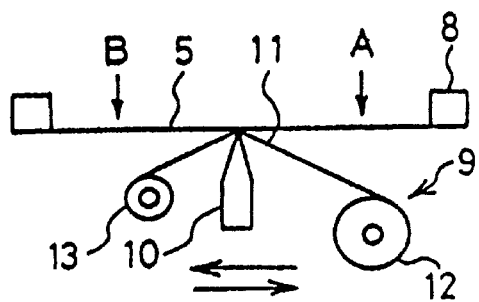
FIG. 5 is a schematic sectional view of a conventional cleaning device.
Figure 6:
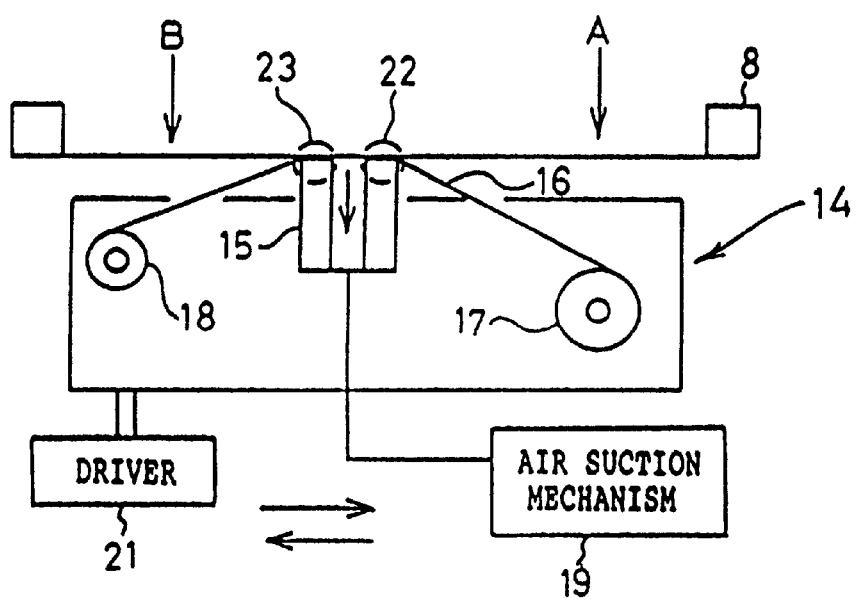
FIG. 6 is a schematic sectional view of another conventional cleaning device.

FIG. 3 shows a cleaning process according to another embodiment of the invention. This embodiment differs from the first embodiment in that several suction flow rates are registered in advance so that a suitable flow rate for the type of the board 1 to print on or the type of cream solder 4 is selected therefrom and set. Thereby, cleaning can be performed with a suction flow rate which is matched from the beginning with the type of the cream solder 4 to be used and the shape of the openings on the screen mask 5.

Performing the cleaning operation which has been described so far makes it possible to remove not only the cream solder 4 which moves around to the back of the screen mask 5 but also the cream solder 4 which adheres to the openings 6 in the screen mask 5; therefore, the cream solder 4 can be uniformly printed on or applied to the circuit board 1 without causing printing defects, such as the so-called omission.

(Embodiment 3)

In the first embodiment, the description has been given of the case in which the openings 6 in the screen mask 5 are inspected by the inspecting camera 24. However, the cream solder 4 printed on the circuit board 1 may be inspected by the inspecting camera 24 and the cleaning operation may be repeated according to the results of the inspection. In this case, too, the same effects can be obtained.

What is claimed is:

1. A cleaning device for removing a remnant printing material from a screen mask used in a screen printing process in which a printing material is printed on or applied to a surface of a to-be-printed object through the screen mask having openings formed therein in a predetermined pattern, comprising:

suction means for removing said remnant printing material from the screen mask;

reciprocating means for reciprocating said suction means along the screen mask;

flow rate selecting means for registering in advance a plurality of values as registered set values for a suction flow rate in said suction means according to a kind of printing material to be removed, and for selecting a suitable suction flow rate from said registered set values according to said printing material; and, flow rate variable control means for controlling the suction flow rate in said suction means to make it equal to the suction flow rate selected by said flow rate selecting means.

2. A cleaning device for removing a remnant printing material from a screen mask used in a screen printing process in which a printing material is printed on or applied to a surface of a to-be-printed object through the screen mask having openings formed therein in a predetermined pattern, comprising:

suction means for removing said remnant printing material from the screen mask;

reciprocating means for reciprocating said suction means along the screen mask;

flow rate selecting means for registering in advance a plurality of values as registered set values for a suction flow rate in said suction means and selecting a suitable suction flow rate from said registered set values according to said printing material to be removed;

flow rate variable control means for controlling the suction flow rate in said suction means to make it equal to the suction flow rate selected by said flow rate selecting means; and inspecting means for inspecting the printing material printed on or applied to the surface of said object after printing;

said flow rate variable control means being further controlled according to results of the inspection conducted by said inspecting means.

3. A cleaning method for removing a remnant printing material from a screen mask used in a screen printing process in which a printing material is printed on or applied to a surface of a to-be-printed object through the screen mask having openings formed therein in a predetermined pattern, comprising the steps of:

registering in advance a plurality of values as registered set values for a suction flow rate for removing remnant applied material from the screen mask according to a kind of printing material to be removed; and selecting a suitable suction flow rate from said registered values according to said printing material, thereby to clean the screen mask.

4. A cleaning method for removing a remnant printing material from a screen mask used in a screen printing process in which a printing material is printed on or applied to a surface of a to-be-printed object through the screen mask having openings formed therein in a predetermined pattern, comprising the steps of:

registering in advance a plurality of values as registered set values for a suction flow rate for removing said remnant printing material from the screen mask;

selecting a suitable suction flow rate from said registered set values according to said printing material to be removed;

inspecting the printing material printed on or applied to the surface of the object after printing; and controlling the suction flow rate according to results of an inspection, thereby cleaning the screen mask.

* * * * *